US010103331B2

(12) United States Patent
Park et al.

(10) Patent No.: US 10,103,331 B2
(45) Date of Patent: Oct. 16, 2018

(54) SLURRY FOR POLISHING PHASE-CHANGE MATERIALS AND METHOD FOR PRODUCING A PHASE-CHANGE DEVICE USING SAME

(71) Applicant: IUCF-HYU (Industry-University Cooperation Foundation Hanyang University), Seoul (KR)

(72) Inventors: Jeagun Park, Seongnam-si (KR); Ungyu Paik, Seoul (KR); Jinhyung Park, Ulsan (KR); Hao Cui, Seoul (KR); Jongyoung Cho, Seoul (KR); Heesub Hwang, Seoul (KR); Jaehyung Lim, Incheon (KR); Yehwan Kim, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 15/392,441

(22) Filed: Dec. 28, 2016

(65) Prior Publication Data

US 2017/0141308 A1 May 18, 2017

Related U.S. Application Data

(63) Continuation-in-part of application No. 14/818,261, filed on Aug. 4, 2015, which is a continuation of
(Continued)

(30) Foreign Application Priority Data

Feb. 5, 2010 (KR) .......................... 10-2010-0011142

(51) Int. Cl.
*H01L 45/00* (2006.01)
*C09G 1/02* (2006.01)

(52) U.S. Cl.
CPC ............ *H01L 45/1675* (2013.01); *C09G 1/02* (2013.01); *H01L 45/06* (2013.01); *H01L 45/144* (2013.01)

(58) Field of Classification Search
None
See application file for complete search history.

(56) References Cited

U.S. PATENT DOCUMENTS 7,857,985 B2 * 12/2010 Yamashita ............... C09G 1/02
216/89
2007/0186484 A1 * 8/2007 Yamashita ............... C09G 1/02
51/308

(Continued)

FOREIGN PATENT DOCUMENTS

KR 20090002501 A 1/2009
KR 20090114982 A 11/2009

OTHER PUBLICATIONS

Office Action issued in parent U.S. Appl. No. 14/818,261 dated Jun. 28, 2016.
(Continued)

*Primary Examiner* — Allan Olsen
(74) *Attorney, Agent, or Firm* — Sughrue Mion, PLLC (57) ABSTRACT

The present invention relates to slurry for polishing crystalline phase-change materials and to a method for producing a phase-change device using the same. The slurry for polishing crystalline phase-change materials according to one embodiment of the present invention comprises an abrasive, an alkaline abrasive enhancer, an oxidizing agent having a standard reduction potential higher than that of perchlorates, and ultrapure water. In addition, the method for producing a phase-change device according to one embodiment of the present invention comprises the following steps: preparing a substrate; forming a crystalline phase-change material film on the substrate; and removing the phase-change material film through a chemical-mechanical polishing process using slurry for polishing phase-change materials, which comprises an abrasive, an alkaline abrasive (Continued)

enhancer, an oxidizing agent having a standard reduction potential higher than that of perchlorates, and ultrapure water.

13 Claims, 5 Drawing Sheets

Related U.S. Application Data application No. 13/577,257, filed as application No. PCT/KR2011/000749 on Feb. 1, 2011.

(56) References Cited

U.S. PATENT DOCUMENTS

| | | | |
|---|---|---|---|
| 2008/0135520 A1* | 6/2008 | Sun | C03C 19/00 216/89 |
| 2008/0226928 A1 | 9/2008 | Tanaka et al. | |
| 2009/0104851 A1 | 4/2009 | Cherian et al. | |
| 2009/0176372 A1* | 7/2009 | Minamihaba | C09G 1/02 438/693 |
| 2010/0081279 A1* | 4/2010 | Palmer | C09G 1/02 438/667 |
| 2010/0087065 A1 | 4/2010 | Boggs et al. | |

OTHER PUBLICATIONS

Office Action issued in parent U.S. Appl. No. 14/818,261 dated Mar. 1, 2016.
International Search Report and Written Opinion of PCT/KR2011/000749 dated Oct. 25, 2011.

* cited by examiner

SLURRY FOR POLISHING PHASE-CHANGE MATERIALS AND METHOD FOR PRODUCING A PHASE-CHANGE DEVICE USING SAME

CROSS-REFERENCE TO RELATED APPLICATIONS

This application is a continuation in part of U.S. patent application Ser. No. 14/818,261 filed Aug. 4, 2015, which is a continuation of U.S. patent application Ser. No. 13/577,257 filed Oct. 14, 2012, which is a U.S. national phase application of PCT International Application No. PCT/KR2011/000749, filed Feb. 1, 2011, which claims priority to Korean Patent Application No. 10-2010-0011142 filed on Feb. 5, 2010, the contents of which are incorporated herein by reference in their entirety.

TECHNICAL FIELD

The present disclosure relates to a slurry for polishing a phase-change material and a method of manufacturing a phase-change device by using the same, and more particularly, to a slurry for polishing a crystalline phase-change material and a method of manufacturing a phase-change device by using the same.

BACKGROUND ART

Flash memory and dynamic random access memory (DRAM) are most typically used memory devices. With respect to a flash memory device, information stored therein may not be erased even in the case that power is off, but read speed and write speed in bits may be slow. DRAM may have a high processing speed in bits, but stored information may be erased when power is off. Therefore, recently, research into advanced memory devices having advantages of flash memory and DRAM has been actively conducted.

A phase-change random access memory (PRAM or PCRAM) by using a phase-change material having reversible phase-change characteristics has been suggested as the foregoing advanced memory device.

The phase-change material is denoted as a material in which phase changes into an amorphous state and a crystalline state occur according to Joule heating generated by a current applied thereto. The phase-change memory device includes a phase-change layer including a phase-change material between two electrodes, in which a portion or the entirety of the phase-change layer is changed into a crystalline phase or amorphous phase and stored information is distinguished by using the foregoing state of the phase-change layer. That is, since resistance of a phase-change layer having a plurality of amorphous phases is significantly higher than that of a phase-change layer having a plurality of crystalline phases, magnitudes of currents flowing through the phase-change layers are different when a predetermined magnitude of read voltage is applied thereto. Therefore, the magnitude of the current is sensed to distinguish whether information stored in a cell is 1 or 0.

A tertiary $Ge_2Sb_2Te_5$ alloy having an atomic ratio of germanium (Ge), antimony (Sb), and tellurium (Te) of 2:2:5 is the most commonly used among phase-change memory devices currently being developed and commercialized. Among the tertiary $Ge_2Sb_2Te_5$ alloys, research into nitrogen-doped $Ge_2Sb_2Te_5$ has been very actively conducted.

The foregoing phase-change memory device is composed of a plurality of cells, and since a thermal crosstalk between the adjacent cells is generated when a volume of a phase-change material in each cell is large, the volume thereof must be formed to be small. In addition, the volume of the phase-change material becomes further reduced as integration density of the phase-change material recently increases. Therefore, patterning must be performed so as to dispose the phase-change material in a small volumetric space separated from the other adjacent phase-change materials.

Herein, a wet or dry etching method may be used for patterning a phase-change material. However, with respect to the etching method, processing may be complicate and processing control may be difficult. In order to address the foregoing limitations of the etching process, the phase-change material may be patterned through a relatively simplified Damascene process or self-alignment process. However, in these processes, a small hole or trench having a phase-change material disposed therein is formed in an insulation layer and the hole or the trench is filled with the phase-change material. At this time, the phase-change material on the insulation layer in addition to the inside of the hole or the trench is removed through a chemical mechanical polishing process.

Meanwhile, a state of the deposited phase-change material is determined by a deposition method and a deposition temperature. That is, an amorphous phase may be obtained when the deposition is performed at room temperature and a crystalline phase may be obtained when the deposition is performed at a high temperature. Chemical mechanical polishing characteristics of the amorphous phase and the crystalline phase may be significantly different due to the differences in mechanical hardness, chemical activity, and a bonding structure between elements of the amorphous phase and the crystalline phase of the phase-change material. Therefore, the differences in the foregoing characteristics must also be sufficiently considered when chemical mechanical polishing slurries for the amorphous phase and the crystalline phase are selected. However, since there is currently no slurry for polishing a crystalline phase-change material, research on this is necessary. Also, in the case that a slurry typically used in polishing of an amorphous phase-change material is used for polishing the crystalline phase-change material, there may be difficulties in polishing of the crystalline phase-change material, such as a very low polishing rate.

DISCLOSURE OF THE INVENTION

Technical Problem

The present disclosure provides a slurry for polishing a phase-change material able to polish a phase-change material, in which a state of the phase-change material before polishing is crystalline, and a method of manufacturing a phase-change device by using the slurry.

The present disclosure also provides a slurry for polishing a phase-change material able to improve a polishing rate of a phase-change material and a method of manufacturing a phase-change device by using the slurry.

The present disclosure also provides a slurry for polishing a phase-change material able to improve polishing selectivity between a phase-change material and an insulation layer, and a method of manufacturing a phase-change device by using the slurry.

The present disclosure also provides a slurry for polishing a phase-change material able to obtain a high-quality polished surface by minimizing surface defects such as scratches, and a method of manufacturing a phase-change device by using the slurry.

Technical Solution

In accordance with an exemplary embodiment, a slurry for polishing a phase-change material includes:

an abrasive; an alkaline agent; an oxidizer having a standard reduction potential higher than that of perchlorates; and ultrapure water (De-Ionized Water).

The phase-change material may be a crystalline binary chalcogen alloy or multinary chalcogen alloy.

The abrasive may include at least any one selected from the group consisting of colloidal silica, ceria, fumed silica, and alumina ($Al_2O_3$).

The abrasive may be included in an amount ranging from approximately 0.1 wt % to approximately 10 wt % based on 100 wt % of the slurry for polishing.

The phase-change material may be disposed on an insulation layer and a hardness of the abrasive may be lower than that of the insulation layer.

The alkaline agent may include at least any one of TMAH (tetramethylammonium hydroxide), KOH, NaOH, and $NH_4OH$.

A pH of the slurry for polishing a phase-change material may be in a range of approximately 10 to approximately 12.

The oxidizer may include a material generated from binding between a manganate ion ($MnO_4^-$) and a cation.

The oxidizer may be included in an amount ranging from approximately 0.005 wt % to approximately 0.3 wt % based on 100 wt % of the slurry for polishing.

The slurry for polishing a phase-change material may further include a polishing selectivity control agent included in an amount ranging from approximately 0.0001 wt % to approximately 3 wt % based on 100 wt % of the slurry for polishing.

The polishing selectivity control agent may include a polymer containing an amine group.

The polishing selectivity control agent may include at least any one of primary amine, secondary amine, and tertiary amine.

The polishing selectivity control agent may include at least any one of an acrylic polymer including polyacrylate, polymethylmethacrylate, and polybenzylmethacrylate, polyvinyl pyrrolidone, polyacrylamide, and a salt substituent and a copolymer thereof.

The slurry for polishing a phase-change material may further include a surface roughness modifier included in an amount ranging from approximately 0.00001 wt % to approximately 2 wt % based on 100 wt % of the slurry for polishing.

The surface roughness modifier may be at least any one of cellulose-based materials including hydroxylethylcellulose, carboxylmethyl cellulose, ethyl cellulose, methyl cellulose, hydroxypropyl cellulose, aminoethyl cellulose, oxyethyl cellulose, and hydroxylbutyl methyl cellulose, and a salt compound thereof.

The slurry for polishing a phase-change material may further include a corrosion inhibitor included in an amount ranging from approximately 0.001 wt % to approximately 0.5 wt % based on 100 wt % of the slurry for polishing.

The corrosion inhibitor may include at least any one of azoles including benzotriazole, aminotriazole, and triazole.

In accordance with another exemplary embodiment, a method of manufacturing a phase-change device includes:

preparing a substrate; forming a crystalline phase-change material layer on the substrate; and using a slurry for polishing a phase-change material including an abrasive, an alkaline agent, an oxidizer having a standard reduction potential higher than that of perchlorates, and ultrapure water to remove a portion of the phase-change material layer by using a chemical mechanical polishing process.

The forming of the crystalline phase-change material layer may include depositing as a crystalline phase during the deposition of the phase-change material on the substrate, or depositing in an amorphous state during the deposition of the phase-change material and then performing a subsequent heat treatment process to form as a crystalline phase.

The method may further include forming a lower structure layer including a metal pattern on the substrate and forming an insulation layer on the lower structure layer, after the preparing of the substrate.

The method may further include removing a portion of the insulation layer to form a hole exposing a portion of the metal pattern.

Advantageous Effects

According to the foregoing exemplary embodiments, a phase-change material, in which a state of the phase-change material before polishing is crystalline, may be polished and patterned.

Also, a polishing rate of the phase-change material may not only be improved, but also a chemical etching rate of the phase-change material may be inhibited and polishing selectivity between phase change material and insulation layer may be improved.

Further, a high-quality polished surface may be obtained by minimizing surface defects such as scratches. The high-quality polished surface may decrease contact resistance with an upper electrode to be deposited in a subsequent process and thus, may be favorable in terms of operation of a phase-change device.

BEST MODE FOR CARRYING OUT THE INVENTION

Hereinafter, specific embodiments will be described in detail with reference to the accompanying drawings. In the drawings, like reference numerals refer to like elements throughout. Moreover, detailed descriptions related to well-known functions or configurations will be ruled out in order not to unnecessarily obscure subject matters of the present disclosure.

FIGS. 1 through 5 are cross-sectional views illustrating a method of manufacturing a phase-change device in accordance with an exemplary embodiment.

Figure 1:
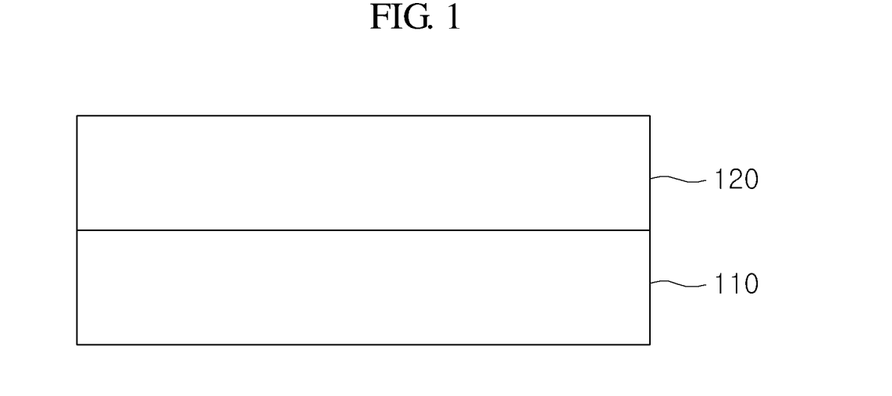
FIGS. 1 through 5 are cross-sectional views illustrating a method of manufacturing a phase-change device in accordance with an exemplary embodiment.

Referring to FIG. 1, an insulation layer 120 is formed on a lower structure layer 110 having a lower structure formed therein. A semiconductor substrate having a metal pattern formed thereon may be used as the lower structure layer 110. Herein, the metal pattern may be patterned into a shape of an interconnection line. Of course, a switching device such as a transistor may be formed on the semiconductor substrate. Also, the metal pattern may include a plurality of metal electrodes and a plurality of interconnection lines connecting therebetween. Further, the metal pattern may be a lower electrode formed under a phase-change layer.

The insulation layer 120 functions to protect a phase-change material, electrically isolate a phase-change material in an adjacent cell, and thermally separate adjacent phase-change materials. Therefore, various material layers able to perform the foregoing functions may be used as the insulation layer 120. In the exemplary embodiment, a silicon oxide ($SiO_2$) layer may be used as the insulation layer 120. The embodiment is not limited thereto and a silicon nitride (SiN) layer or silicon oxynitride (SiON) layer, or a low-k material layer may also be used. The insulation layer 120 may be prepared in a single layer or multilayer structure.

Figure 2:
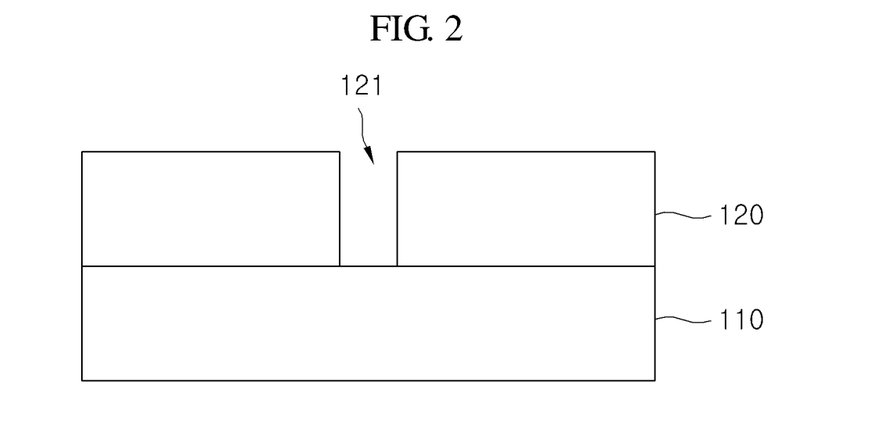

Referring to FIG. 2, a hole 121 exposing a portion of the lower structure layer 110 is formed by removing a portion of the insulation layer 120.

The hole 121 is for patterning the phase-change material layer and may be prepared according to desired size, height, and shape of the phase-change material layer. A portion of the metal pattern of the lower structure layer 110 may be exposed through the hole 121.

First, the insulation layer 120 is coated with a photoresist layer in order to form the foregoing hole 121 in the insulation layer 120. A photoresist mask pattern exposing the insulation layer 120 in a region having the hole to be formed therein and shielding the other region is formed by performing exposure and development processes (i.e., photolithography process) using a photomask. Thereafter, the hole 121 is formed by removing the insulation layer 120 exposed through an etching process using the photoresist mask pattern as an etch mask. The hole 121 is formed and the remaining photoresist mask pattern is then removed. The embodiment is not limited thereto and a hard mask layer pattern may be formed by forming a hard mask layer instead of the photoresist layer on the insulation layer 120 and removing a portion thereof, and then the hole may be formed by using the hard mask layer pattern as an etch mask. Herein, a photoresist layer may be used to form the hard mask layer pattern. Also, the hole 121 may be formed in such a manner that a photoresist mask pattern is first formed on the lower structure layer 110 and the insulation layer 120 is then formed, the insulation layer 120 is planarized and the photoresist mask pattern is exposed through polishing, and subsequently, the exposed photoresist mask pattern is removed. Further, the hole 121 may be formed not by an etching process, but by a laser beam or through a boring process by using a boring machine.

Figure 3:
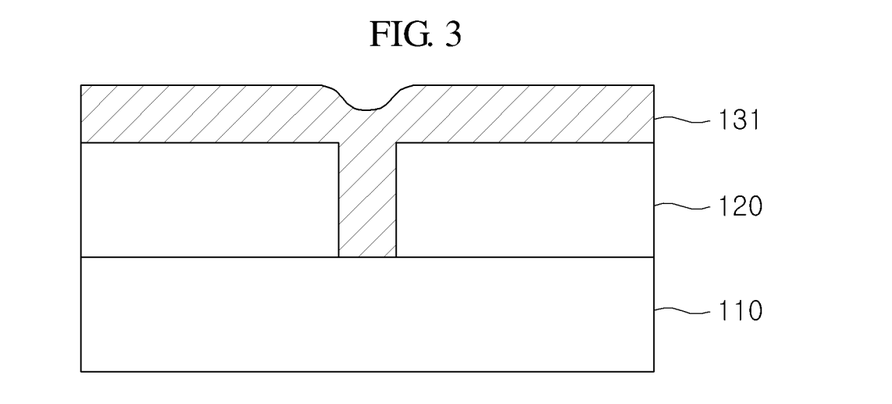
Figure 4:
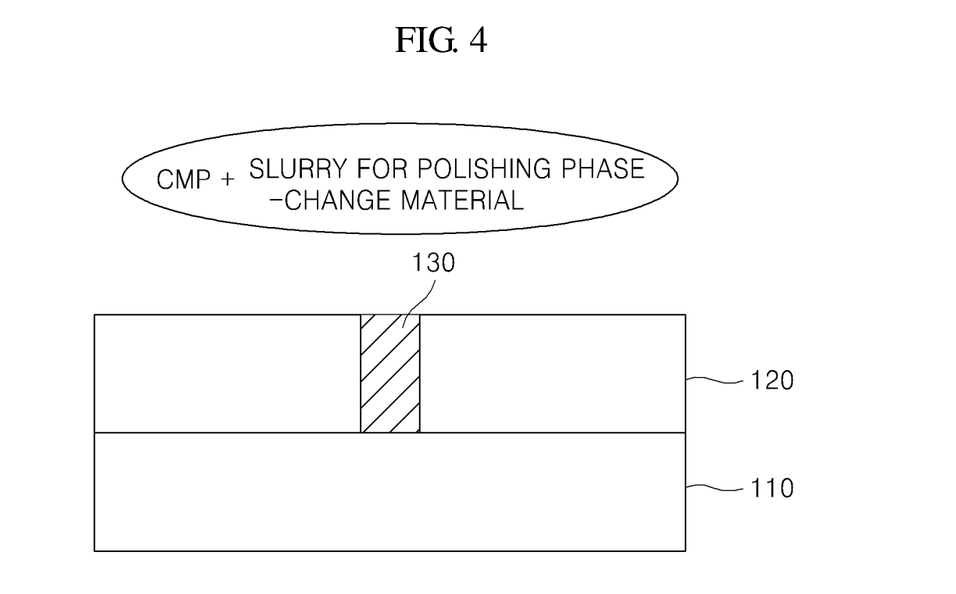

Referring to FIGS. 3 and 4, a phase-change layer 130 filling the inside of the hole 121 and including a phase-change material is formed.

The phase-change material is denoted as a material generating a reversible phase change between a crystalline state and an amorphous state according to amplitude and cycle of current applied. The phase-change material may be a compound including any one or more of germanium (Ge), antimony (Sb), or tellurium (Te). Examples of the phase-change material may be InSe, $Sb_2Te_3$, GeTe, $Ge_2Sb_2Te_5$, InSbTe, GaSeTe, $SnSb_2Te_4$, InSbGe, AgInSbTe, (GeSn)SbTe, GeSb(SeTe), and $Te_{81}Ge_{15}Sb_2S_2$. In an exemplary embodiment, chalcogenide (GST) is used as a phase-change material. More particularly, the phase-change material may be a binary chalcogen alloy or multinary chalcogen alloy, and an example thereof may be $Ge_2Sb_2Te_5$.

First, a crystalline phase-change material layer 131 is formed on an entire surface of the insulation layer 120 having the hole 121 formed therein. Herein, the "crystalline" phase-change material layer is denoted as the cases in which a portion or the entirety of the phase-change material layer is crystallized, an amount of a crystalline phase is more than that of an amorphous phase, and both a single crystalline state and a polycrystalline state are included. The crystalline phase-change material layer 131 may be formed by performing deposition at a high temperature. Also, the crystalline phase-change material layer 131 may be formed by depositing a phase-change material at a low temperature and then performing a heat treatment. In an exemplary embodiment, approximately 2000 Å thick crystalline phase-change material layer 131 is formed by depositing a $Ge_2Sb_2Te_5$ phase-change material by direct current (DC) magnetic sputtering at approximately 200° C. The embodiment is not limited thereto and the crystalline phase-change material layer 131 may also be deposited along a surface step height of the insulation layer 120 so as to fill the inside of the hole 121 by using a metal organic chemical vapor deposition (MOCVD) method. In addition, the crystalline phase-change material layer 131 may be formed inside the hole 121 by a chemical vapor deposition (CVD) or physical vapor deposition (PVD) or atomic layer deposition (ALD) method. The crystalline phase-change material layer 131 may also be formed by using an atomic layer-chemical vapor deposition (AL-CVD) method in which CVD and ALD methods are combined.

The crystalline phase-change material layer 131 is formed to fill the inside of the hole 121 and the phase-change layer 130 is then formed by removing the phase-change material layer 131 formed on the insulation layer 120 in the other region excluding a hole 121 region. At this time, a chemical mechanical polishing (CMP) process is performed to remove the phase-change material layer 131. Herein, the CMP process is performed by using a slurry for polishing a phase-change material according to an exemplary embodiment, wherein the insulation layer 120 is used as a polishing stop layer. The phase-change material layer 131 on the insulation layer 120 excluding the hole region 121 is removed through the CMP process to form the phase-change layer 130 inside the hole 121. In the case that the slurry for polishing a phase-change material according to the exemplary embodiment is used, it is sufficient that the phase-change material is formed as a crystalline phase in the CMP process, regardless of what phase the phase-change material is formed as before the CMP process.

Figure 5:
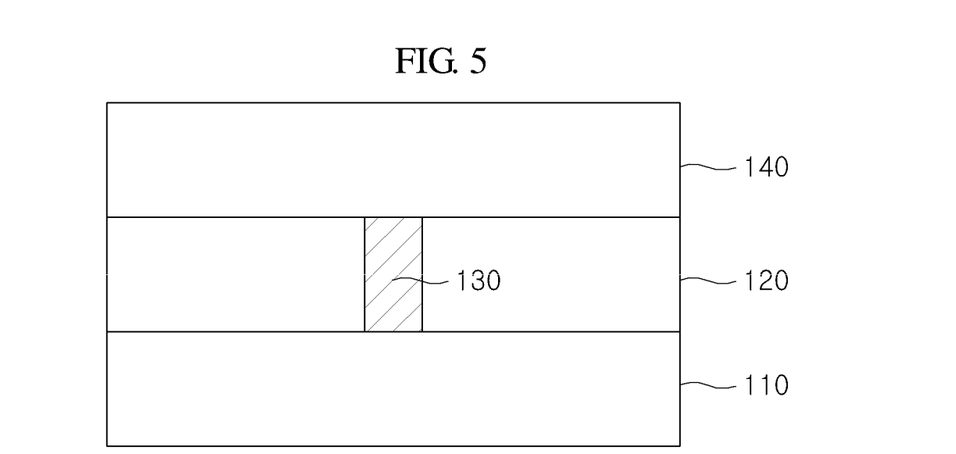

The phase-change material on the insulation layer 120 is polished and removed by performing the CMP process and a phase-change device is then manufactured by performing a typical subsequent process, e.g., forming a plurality of upper electrodes 140 with a metal pattern or the like on the insulation layer 120 and the phase-change layer 130, and forming a plurality of interconnection lines connecting therebetween.

The slurry for polishing a phase-change material for polishing the phase-change material layer formed of a crystalline phase may include an abrasive, an alkaline agent for improving polishing property, an oxidizer(oxidizing agent), and ultrapure water. Also, the slurry may include a polishing selectivity control agent, a surface roughness modifier, and a corrosion inhibitor.

A material capable of effectively polishing a phase-change material may be used as the abrasive. At this time, a material softer than a material used as the insulation layer 120 disposed under the phase-change material, e.g., $SiO_2$, may be used as an abrasive. That is, since the phase-change material is disposed on the insulation layer, the abrasive having a hardness lower than that of the insulation layer may be used. In an exemplary embodiment, the abrasive includes at least any one selected from the group consisting of colloidal silica, ceria, fumed silica, and alumina ($Al_2O_3$). A core-shell type abrasive may be used, in which surfaces of the foregoing materials are coated with a polymer. Also, a content of the abrasive may be included in a range of approximately 0.1 wt % to approximately 10 wt % based on 100 wt % of the slurry for polishing. When the content of the abrasive is included less than approximately 0.1 wt %, a polishing effect may be insignificant, and the polishing effect reaches the maximum when the content of the abrasive is approximately 10 wt %. When the content of the abrasive is greater than approximately 10 wt %, unnecessary costs may be generated as an increase in the polishing effect is insignificant. Further, a primary particle diameter of abrasive particles constituting the abrasive may be in a range of approximately 5 nm to approximately 100 nm and a secondary particle diameter may be in a range of approximately 10 nm to approximately 200 nm.

A material able to adjust a pH to an alkaline region and increase polishing rate and polishing selectivity of the phase-change material may be used as the alkaline agent. In an exemplary embodiment, tetramethylammonium hydroxide (TMAH) is used as an alkaline agent. The embodiment is not limited thereto and at least any one of KOH, NaOH, and $NH_4OH$ may be used as an alkaline agent. However, TMAH may be preferred as the alkaline agent. In the slurry for polishing according to the embodiment, a content of the alkaline agent may be included to obtain a pH of the slurry ranging from approximately 10 to approximately 12. When the pH of the slurry is less than approximately 10, adsorption of the abrasive may occur at a surface, and when the pH of the slurry is greater than approximately 12, a chemical etching damage of the phase-change material may increase, and also, risks in handling and transportation of the slurry may increase.

In the case that a typical slurry for polishing is used to polish a crystalline phase-change material, efficiency decreases as a polishing rate thereof is significantly lower than that of an amorphous phase-change material. Also, a desired level of polishing may not be performed as adsorption of the abrasive or the like may occur. In order to compensate for this, an oxidizer is added as a component of the slurry for polishing in an exemplary embodiment. A material having a standard reduction potential higher than that of perchlorates and having stable characteristics in an alkaline environment may be used as the oxidizer. Herein, the material having stable characteristics in an alkaline environment is referred to as a material that does not precipitate in a solid state in an alkaline environment. A material having such characteristics may include a material generated from binding between a manganate ion ($MnO_4^-$) and a cation. More particularly, a permanganate acid ($HMnO_4$) generated from binding between a permanganate ion ($MnO_4^-$) and a hydrogen ion ($H^+$), potassium permanganate ($KMnO_4$) generated from binding between a permanganate ion ($MnO_4^-$) and a potassium ion ($K^+$), sodium permanganate ($NaMnO_4$) generated from binding between a permanganate ion ($MnO_4^-$) and a sodium ion ($Na^+$), magnesium permanganate ($Mg(MnO_4)_2$) generated from binding between a permanganate ion ($MnO_4^-$) and a magnesium ion ($Mg^{2+}$), calcium permanganate ($Ca(MnO_4)_2$) generated from binding between a permanganate ion ($MnO_4^-$) and a calcium ion ($Ca^{2+}$), and ammonium permanganate ($NH_4MnO_4$) generated from binding between a permanganate ion ($MnO_4^-$) and an ammonium ion ($NH_4^-$). At this time, the oxidizer may be included in an amount ranging from approximately 0.005 wt % to approximately 1 wt % based on 100 wt % of the slurry for polishing. When a content of the oxidizer is less than approximately 0.005 wt %, an effect of improving a polishing rate may be insignificant, and when the content of the oxidizer is greater than approximately 1 wt %, an etching rate of the phase-change material may be higher than the desired rate, and thus, dishing may occur. Further, the oxidizer may be included in an amount ranging from approximately 0.05 wt % to approximately 0.3 wt %, specifically from approximately 0.2 wt % to approximately 0.3 wt % based on 100 wt % of the slurry for polishing considering the polishing selectivity of the phase-change material or the phase-change layer (130 of FIGS. 3 and 4) to the insulation material or the insulation layer (120 of FIGS. 3 and 4).

Alkaline agent to oxidizer weight ratio may ranges from approximately 0.24 to approximately 0.8, specifically from approximately 0.24 to approximately 0.6, for example from approximately 0.4 to approximately 0.6 for the improved polishing selectivity of the phase-change material or the phase-change layer (130 of FIGS. 3 and 4) to the insulation material or the insulation layer (120 of FIGS. 3 and 4).

Also, the slurry for polishing a phase-change material according to the embodiment may further include a polishing selectivity control agent in addition to the abrasive and k the alkaline agent. A polishing rate with respect to the phase-change material may be further improved as well as a polishing rate of the insulation layer (e.g., $SiO_2$ layer) being reduced by the polishing selectivity control agent, and polishing selectivity may be further increased by the polishing selectivity control agent. A polymer containing an amine group may be used as the polishing selectivity control agent, and examples of the polymer may be primary amine, secondary amine, or tertiary amine. In addition, a material including at least any one of an acrylic polymer including polyacrylate, polymethylmethacrylate, and polybenzylmethacrylate, polyvinyl pyrrolidone, polyacrylamide (PAM), and a salt substituent and a copolymer thereof may be used as the polishing selectivity control agent. In particular, polyacrylamide (PAM) may be used as the polishing selectivity control agent. Also, the polishing selectivity control agent may be included in an amount ranging from approximately 0.0001 wt % to approximately 3 wt % based on 100 wt % of the slurry for polishing. The polishing selectivity control agent is used for inhibiting polishing of the insulation layer, and when the polishing selectivity control agent is included less than approximately 0.0001 wt %, polishing selectivity may be low as an effect of inhibiting polishing of the insulation layer may be insignificant, and when the polishing selectivity control agent is included greater than approximately 3 wt %, unnecessary costs may be generated as an effect of increasing polishing selectivity may be insignificant.

Further, the slurry for polishing a phase-change material according to the embodiment may further include a surface roughness modifier in addition to the abrasive, the alkaline agent, the oxidizer, and the selectivity control agent. Generation of scratches on the polished surface may be prevented by decreasing surface roughness of the polished surface through the surface roughness modifier. The surface roughness modifier may include a cellulose-based material. More particularly, at least any one of cellulose-based materials including hydroxylethylcellulose (HEC), carboxylmethyl cellulose, ethyl cellulose, methyl cellulose, hydroxypropyl cellulose, aminoethyl cellulose, oxyethyl cellulose, and hydroxylbutyl methyl cellulose, and a salt compound between the cellulose-based materials may be used. In an exemplary embodiment, HEC is used as a surface roughness modifier. The surface roughness modifier may be included in an amount ranging from approximately 0.00001 wt % to approximately 2 wt % based on 100 wt % of the slurry for polishing. When the surface roughness modifier is included less than approximately 0.00001 wt %, an effect of controlling a surface roughness may be insignificant, and when the surface roughness modifier is included greater than approximately 2 wt %, unnecessary costs may be generated as an effect of improving the control of surface roughness may be insignificant.

Also, the slurry for polishing a phase-change material according to the embodiment may further include a corrosion inhibitor in addition to the abrasive, the alkaline agent, the oxidizer, the selectivity control agent, and the surface roughness modifier. Since corrosive action with respect to the phase-change material is increased by the addition of the oxidizer in the slurry for polishing, the corrosion inhibitor is added to prevent this. The corrosion inhibitor may include at least any one of azoles including benzotriazole, aminotriazole, and triazole. At this time, the corrosion inhibitor may be included in an amount ranging from approximately 0.001 wt % to approximately 0.5 wt % based on 100 wt % of the slurry for polishing. When the corrosion inhibitor is included less than approximately 0.001 wt %, an effect of preventing corrosion may be insignificant, and when the corrosion inhibitor is included greater than approximately 0.5 wt %, unnecessary costs may be generated as an effect of improving the prevention of surface corrosion may be insignificant.

MODE FOR CARRYING OUT THE INVENTION

Hereinafter, detailed experimental examples of manufacturing slurries for polishing a phase-change material having various component materials and composition ratios, and polishing phase-change materials by using the slurries will be described.

Figure 6:
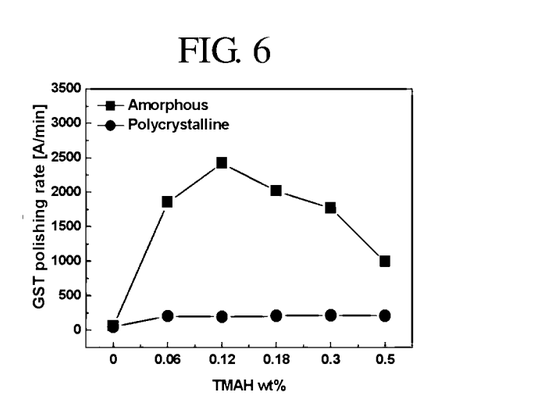
FIG. 6 is a graph showing polishing rates of amorphous and crystalline phase-change materials according to an addition amount of an alkaline agent, tetramethylammonium hydroxide (TMAH)

Referring to FIG. 6 illustrating polishing rates of amorphous and crystalline phase-change materials according to an addition amount of an alkaline agent before describing the experimental examples, it may be confirmed that the polishing rate of the amorphous phase-change material increased before adding an alkaline agent (e.g., tetramethylammonium hydroxide (TMAH)) in an amount of approximately 0.12 wt % based on 100 wt % of the slurry for polishing, and thereafter, decreased. Further, when TMAH was between approximately 0.06 wt % to approximately 0.3 wt % based on 100 wt % of the slurry for polishing, the polishing rate of the amorphous phase-change material was above 1500 Å/min. Therefore, the appropriate amount of TMAH may be between approximately 0.06 wt % to approximately 0.3 wt %, for example, approximately 0.12 wt %. However, it may be confirmed that the crystalline phase-change material exhibited no relationship between the addition amount of TMAH and the polishing rate. That is, the crystalline phase-change material was difficult to be polished even in the case that the alkaline agent was added.

Hereafter, inventors of the present disclosure deduced relationships related to polishing rate and polishing selectivity between an oxidizer and a crystalline phase-change material by adding various oxidizers in predetermined ratios.

EXPERIMENTAL EXAMPLES

Slurries containing the foregoing component materials were prepared. First, a pretreatment of an abrasive (e.g., colloidal silica) was performed. Subsequently, ultrapure water and the abrasive were mixed in a mixer. An alkaline agent, an oxidizer, a selectivity controlling agent, a surface roughness modifier, and a corrosion inhibitor were added at the foregoing ratios to be dispersed and stabilized in the mixer. A pH was adjusted and the slurries were stabilized by using the alkaline agent. Thereafter, large particles were removed by using filters to complete the preparation of the slurries. Specific component materials and composition ratios of the slurries for polishing a phase-change material are presented in Table 1.

TABLE 1

| Category | Silica (wt %) | TMAH (wt %) | Polyacrylamide (wt %) | Oxidizer (wt %) | | | | pH |
|---|---|---|---|---|---|---|---|---|
| | | | | $KClO_4$ | $H_2O_2$ | $KMnO_4$ | $TMAH/KMnO_4$ | |
| Comparative Example 1 | 1.3 | 0.12 | 0.06 | | | 0 | | 10.99 |
| Experimental Example 1 | 1.3 | 0.12 | 0.06 | 0.05 | | | | 10.78 |
| Experimental Example 2 | 1.3 | 0.12 | 0.06 | 0.10 | | | | 10.66 |
| Experimental Example 3 | 1.3 | 0.12 | 0.06 | 0.30 | | | | 10.44 |
| Experimental Example 4 | 1.3 | 0.12 | 0.06 | | 0.05 | | | 10.86 |
| Experimental Example 5 | 1.3 | 0.12 | 0.06 | | 0.10 | | | 10.78 |

TABLE 1-continued

| Category | Silica (wt %) | TMAH (wt %) | Polyacrylamide (wt %) | Oxidizer (wt %) KClO$_4$ | Oxidizer (wt %) H$_2$O$_2$ | Oxidizer (wt %) KMnO$_4$ | TMAH/KMnO$_4$ | pH |
|---|---|---|---|---|---|---|---|---|
| Experimental Example 6 | 1.3 | 0.12 | 0.06 | | 0.30 | | | 10.43 |
| Experimental Example 7 | 1.3 | 0.12 | 0.06 | | | 0.05 | 2.4 | 10.83 |
| Experimental Example 8 | 1.3 | 0.12 | 0.06 | | | 0.10 | 1.2 | 10.70 |
| Experimental Example 9 | 1.3 | 0.12 | 0.06 | | | 0.15 | 0.8 | 10.57 |
| Experimental Example 10 | 1.3 | 0.12 | 0.06 | | | 0.2 | 0.6 | 10.48 |
| Experimental Example 11 | 1.3 | 0.12 | 0.06 | | | 0.25 | 0.48 | 10.45 |
| Experimental Example 12 | 1.3 | 0.12 | 0.06 | | | 0.30 | 0.4 | 10.40 |
| Experimental Example 13 | 1.3 | 0.06 | 0.06 | | | 0.25 | 0.24 | 10.27 |
| Experimental Example 14 | 1.3 | 0.06 | 0.06 | | | 0.3 | 0.2 | 10.20 |

Approximately 1.3 wt % (hereinafter, wt % is based on 100 wt % of the slurry for polishing) of colloidal silica having a primary particle diameter of approximately 35 nm and a secondary particle diameter of approximately 70 nm based on 100 wt % of the slurry for polishing was used as abrasive particles and the colloidal silica was uniformly dispersed in ultrapure water. Approximately 0.12 wt % or 0.06 wt % of TMAH was used as an alkaline agent and approximately 0.06 wt % of polyacrylamide was used to examine polishing selectivity between a phase-change material layer and a silicon oxide layer. The oxidizer was not added in Comparative Example 1 and potassium perchlorates (KClO$_4$) was used as an oxidizer in Experimental Examples 1 to 3. Hydrogen peroxide (H$_2$O$_2$) was used as an oxidizer in Experimental Examples 4 to 6 and potassium permanganate (KMnO$_4$) was used as an oxidizer in Experimental Examples 7 to 14. Specific concentrations of the oxidizers are listed in Table 1. pHs of the slurries for polishing were in a range of approximately 10.5 to approximately 11.0.

Polishing was performed on an 8-inch wafer having a nitrogen-doped polycrystalline Ge$_2$Sb$_2$Te$_5$ phase-change material formed on an entire surface of a silicon wafer. An approximately 2000 Å thick phase-change material layer was formed by depositing a Ge$_2$Sb$_2$Te$_5$ phase-change material by direct current (DC) magnetic sputtering at approximately 200° C. A 7000 Å thick silicon oxide layer was formed on a separate wafer by using tetra ethyl ortho silicate (TEOS) as a raw material through a plasma chemical vapor deposition (CVD) process.

A 6EC apparatus of Strasbaugh (refer to "www.strasbaugh.com") was used as a polishing apparatus and IC 1000/Suba IV CMP pads of Rohm & Haas were used as polishing pads. Polishing were performed respectively on the wafer having the phase-change material layer formed thereon and the wafer having the silicon oxide layer formed thereon for approximately 30 seconds and approximately 60 seconds under a polishing condition including a down force pressure of approximately 3.0 psi, a speed of both a table and a spindle of approximately 70 rpm, and a flow rate of the slurries of approximately 100 mL/min.

TABLE 2

| Category | Polishing rate [Å/min] Ge$_2$Sb$_2$Te$_5$ | Polishing rate [Å/min] SiO$_2$ | Selectivity | Ge$_2$Sb$_2$Te$_5$ etching rate [Å/min] KClO$_4$ | Ge$_2$Sb$_2$Te$_5$ etching rate [Å/min] H$_2$O$_2$ | Ge$_2$Sb$_2$Te$_5$ etching rate [Å/min] KMnO$_4$ |
|---|---|---|---|---|---|---|
| Comparative Example 1 | 123 | 7 | 17.6:1 | | <5 | |
| Experimental Example 1 | 67 | 8 | 7.4:1 | 10 | | |
| Experimental Example 2 | 58 | 14 | 4.14:1 | 3 | | |
| Experimental Example 3 | 43 | 35 | 1.2:1 | 9 | | |
| Experimental Example 4 | 270 | 7 | 38.6:1 | | 279 | |
| Experimental Example 5 | 404 | 10 | 40.4:1 | | 337 | |
| Experimental Example 6 | 603 | 12 | 52.3:1 | | 657 | |
| Experimental Example 7 | 603 | 8 | 75.3:1 | | | 9 |
| Experimental Example 8 | 968 | 12 | 80.6:1 | | | 60 |
| Experimental Example 9 | 1638 | 15 | 109.2:1 | | | |
| Experimental Example 10 | 2849 | 22 | 129.5:1 | | | |
| Experimental Example 11 | 3918 | 30 | 130.6:1 | | | |
| Experimental Example 12 | 4750 | 36 | 131.9:1 | | | 114 |
| Experimental Example 13 | 3917 | 33 | 118.6:1 | | | |
| Experimental Example 14 | 4779 | 49 | 97.5:1 | | | |

Figure 7:
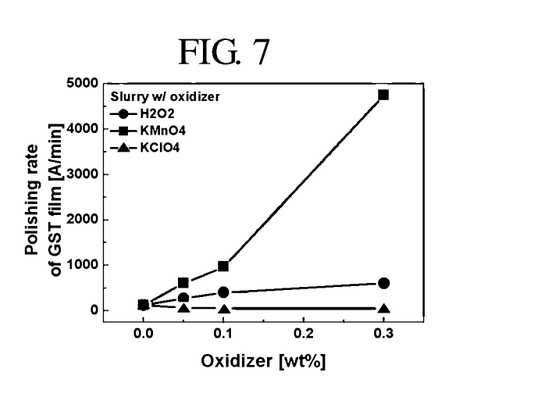
FIG. 7 is a graph showing a polishing rate of each slurry in Table 1 for a $Ge_2Sb_2Te_5$ phase-change material.
Figure 8:
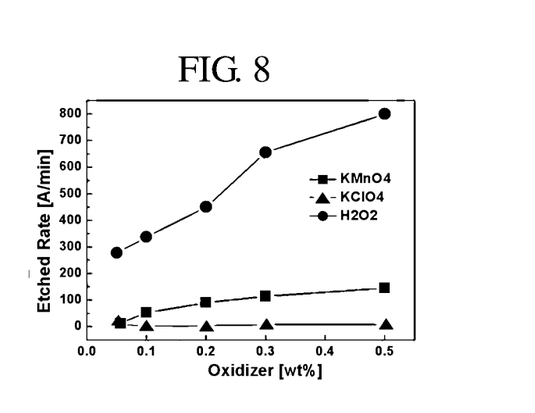
FIG. 8 is a graph showing an etching rate of each slurry in Table 1 for a $Ge_2Sb_2Te_5$ phase-change material.

Table 2 presents the results of measuring polishing rate, etching selectivity, and etching rate for each slurry of Table 1. Also, FIG. 7 is a graph showing a polishing rate of each slurry according to Comparative Example 1, Experimental Examples 1-8 and 12 in Table 1 for a Ge$_2$Sb$_2$Te$_5$ phase-change material, and FIG. 8 is a graph showing an etching rate of each slurry according to Comparative Example 1, Experimental Examples 1-8 and 12 in Table 1 for a Ge$_2$Sb$_2$Te$_5$ phase-change material.

As shown in Table 2, in the cases of Experimental Examples 1 to 3 in which potassium perchlorate, a type of perchlorates, were added, etching rates excluding that of Experimental Example 2 were slightly increased according to the content thereof in comparison to that of Comparative Example 1. However, it may be confirmed that polishing rates for polishing crystalline $Ge_2Sb_2Te_5$ material layers were rather decreased. Hence, it may be confirmed that perchlorates were not suitable for an oxidizer added to a slurry for polishing a crystalline phase-change material.

In the cases of Experimental Examples 4 to 6 in which hydrogen peroxide were added, it may be confirmed that polishing rates and polishing selectivities increased as contents of hydrogen peroxide were increased. In particular, referring to Table 2 and FIG. 8, it may be confirmed that etching rates for crystalline $Ge_2Sb_2Te_5$ phase-change materials were much faster than those of the cases having other oxidizers added thereto.

In the cases of Experimental Examples 7, 8, and 12 in which potassium permanganate ($KMnO_4$) were added, it may be confirmed that polishing rates and polishing selectivities increased as contents of potassium permanganate were increased. Referring to Table 2 and FIG. 7, it may be confirmed that polishing rates and polishing selectivities were significantly increased in comparison to those of Examples 4 to 6 in which hydrogen peroxide were added. In particular, when the addition amount of potassium permanganate was approximately 0.3 wt % (Experimental Example 12), it may be confirmed that a polishing rate of a crystalline $Ge_2Sb_2Te_5$ material layer was increased to approximately 39 times in comparison to that of the case having no oxidizer (Comparative Example 1) and was increased to approximately 8 times in comparison to that of the case containing approximately 0.3 wt % of hydrogen peroxide (Experimental Example 6).

In consideration of a net chemical etching rate, it may be confirmed that the slurries containing potassium permanganate had high polishing rates and polishing selectivities, but etching rates of phase-change materials were significantly lower than those of the slurries containing hydrogen peroxide. Due to the foregoing characteristics of the slurries containing potassium permanganate, the slurries containing potassium permanganate may be favorable to the slurries containing hydrogen peroxide in view of dishing and uniformity during chemical mechanical polishing.

Figure 9:
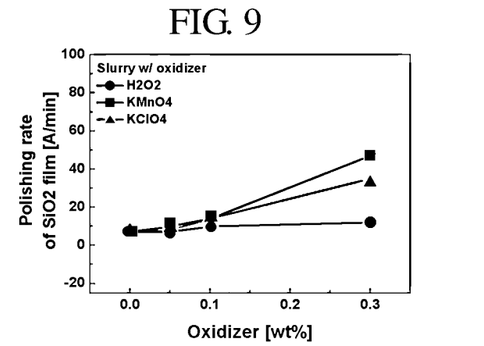
FIG. 9 is a graph showing a polishing rate of each slurry in Table 1 for a silicon oxide ($SiO_2$) layer.

In contrast, referring to Table 2 and FIG. 9, it may be confirmed that addition of the oxidizer did not greatly affect a polishing rate of the silicon oxide layer. Therefore, it may be confirmed that polishing selectivity between the phase-change material layer and the silicon oxide layer also increased as the weight % of potassium permanganate increased.

Referring to FIGS. 6 to 9 and Table 2, it may be understood that an oxidizer added to a slurry for polishing a crystalline phase-change material may have a standard electrode potential (in detail, standard reduction potential) higher than that of perchlorates, and for example, may include a material generated from binding between a permanganate ion ($MnO_4^-$) and a cation. Also, it may be understood that the oxidizer may be included in an amount ranging from approximately 0.005 wt % to approximately 0.3 wt % based on 100 wt % of the slurry for polishing.

Figure 10:
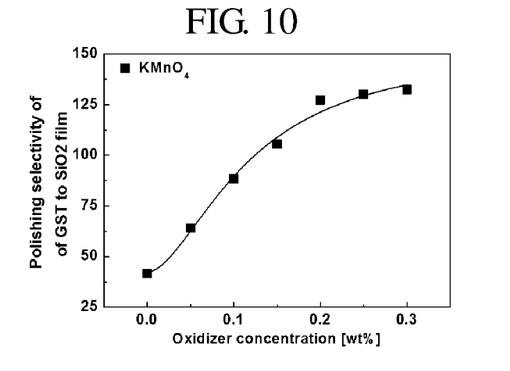
FIG. 10 is a graph showing polishing selectivity of crystalline $Ge_2Sb_2Te_5$ film to $SiO_2$ film of each slurry according to Comparative Example 1, and Experimental Examples 7-12 in Table 1.

FIG. 10 is a graph showing polishing selectivity of crystalline $Ge_2Sb_2Te_5$ film to $SiO_2$ film of each slurry according to Comparative Example 1, and Experimental Examples 7-12 in Table 1.

Referring to FIG. 10, when the addition amount of $KMnO_4$ was from approximately 0.05 wt % to approximately 0.3 wt % based on 100 wt % of the slurry (Experimental Examples 7-12), it may be confirmed that polishing selectivity of crystalline $Ge_2Sb_2Te_5$ film to $SiO_2$ film was increased in comparison to that of the case having no oxidizer (Comparative Example 1). Further, when the addition amount of $KMnO_4$ was between approximately 0.2 wt % to approximately 0.3 wt % based on 100 wt % of the slurry (Experimental Examples 10-12), it may be confirmed that polishing selectivity of crystalline $Ge_2Sb_2Te_5$ film to $SiO_2$ film was saturated even though the addition amount of $KMnO_4$ was increased. Therefore, it may be understood that, when the amount of oxidizer ranges from approximately 0.2 wt % to approximately 0.3 wt % in the slurry, low variation in polishing selectivity is provided even when a deviation of the amount of the oxidizer is occurred.

Figure 11:
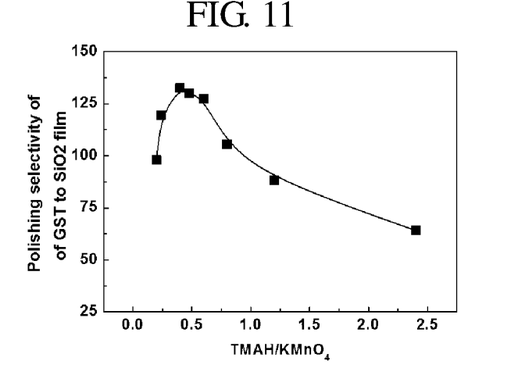
FIG. 11 is a graph showing polishing selectivity of crystalline $Ge_2Sb_2Te_5$ film to $SiO_2$ film according to TMAH/KMnO4 weight ratio of each slurry according to Experimental Examples 7-14 in Table 1.

FIG. 11 is a graph showing polishing selectivity of crystalline $Ge_2Sb_2Te_5$ film to $SiO_2$ film according to TMAH/$KMnO_4$ weight ratio of each slurry according to Experimental Examples 7-14 in Table 1.

Referring to FIG. 11, when TMAH/$KMnO_4$ weight ratio was between approximately 0.24 and approximately 0.8 (Experimental Examples 9-13), the polishing selectivity of crystalline $Ge_2Sb_2Te_5$ film to $SiO_2$ film was over 100. Further, considering the polishing selectivity of crystalline $Ge_2Sb_2Te_5$ film to $SiO_2$ film, TMAH/$KMnO_4$ weight ratio between approximately 0.24 and approximately 0.6 (Experimental Examples 10-13) is preferred, and TMAH/$KMnO_4$ weight percent ratio between approximately 0.4 and approximately 0.6 (Experimental Examples 10-12) is more preferred.

Figure 12:
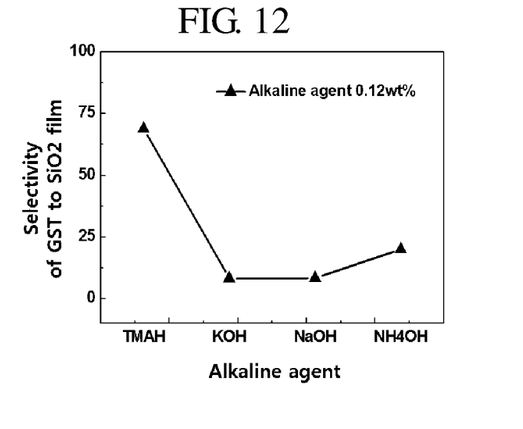
FIG. 12 is a graph showing polishing selectivity of crystalline $Ge_2Sb_2Te_5$ film to $SiO_2$ film according to each of different alkaline agents at the same amount of 0.12 wt % based on 100 wt % of the slurry.

FIG. 12 is a graph showing polishing selectivity of crystalline $Ge_2Sb_2Te_5$ film to $SiO_2$ film according to each of different alkaline agents at the same amount of 0.12 wt % based on 100 wt % of the slurry. The slurry including TMAH at the amount of 0.12 wt % is the slurry of Experimental Example 7, and each slurry including KOH, NaOH, or NH4OH at the amount of 0.12 wt % had the same composition to the slurry of Experimental Example 7 except for the kind of alkaline agent.

Referring to 12, the polishing selectivity of crystalline $Ge_2Sb_2Te_5$ film to $SiO_2$ film of the slurry including TMAH is superior in comparison with the slurries including other alkaline agents like KOH, NaOH, or NH4OH. Therefore, it may be understood that TMAH is preferred for an alkaline agent in a slurry to selectively polish crystalline $Ge_2Sb_2Te_5$ film. [Table 3]

| Category | Nano View (0.621 × 0.485 mm) | | AFM (20 × 20 μm) |
|---|---|---|---|
| | Rq [nm] | Scratch [#/cm$^2$] | Rq [nm] |
| Experimental Example 1 | 1.75 | 0.4 | 3.196 |
| Experimental Example 2 | 1.78 | 0.8 | 4.293 |
| Experimental Example 3 | 1.91 | 2.5 | 4.756 |
| Experimental Example 4 | 1.17 | 0.8 | 2.658 |
| Experimental Example 5 | 1.34 | 2.1 | 2.584 |
| Experimental Example 6 | 3.24 | 17 | 4.427 |
| Experimental Example 7 | 2.25 | 11.9 | 9.515 |
| Experimental Example 8 | 2.57 | 5.1 | 6.613 |
| Experimental Example 12 | 2.14 | 0.0 | 4.144 |

Table 3 presents surface roughnesses and scratches of phase-change materials before and after polishing observed by using a white-light scanning interferometer (Nano View) and an atomic force microscope (AFM). "#" in Table 3 denoted as the number of scratches. Since Nano View observed a surface in a wide measurement range (units of mm$^2$), a scratch level may also be observed. However, since the AFM had a measurement range having units of μm$^2$, the AFM may precisely observe surface roughness generated by surface chemical etching. Values of surface roughness were all presented as root-mean square (Rq) values. Herein, in the case of Comparative Example 1 different from Tables 1 and 2, values related to surface roughness and scratch were not listed because polishing was not performed.

As shown in Table 3, in the cases of Experimental Examples 1 to 3 in which perchlorates were added as an oxidizer, it may be confirmed that surface roughness value and the number of scratches were smaller than those of other Experimental Examples because polishing was not facilitated.

In the cases of Experimental Examples 4 to 6 in which hydrogen peroxide were added, it may be confirmed that etching rates rapidly increased as the content of hydrogen peroxide increased and thus, surface roughness values and the number of scratches were rapidly increased.

In the cases of Experimental Examples 7, 8, and 12 in which potassium permanganate ($KMnO_4$) were added, it may be confirmed that increases in etching rates were slow according to the increases in the contents of potassium permanganate and thus, surface roughness values and the number of scratches were gradually decreased (see FIG. 8). However, in the case of Experimental Example 8 in Table 3, it may be confirmed that a measured value of Nano View was increased but a surface roughness value obtained from the AFM, which may more precisely observe surface roughness in comparison to Nano View, was decreased.

According to the foregoing Experimental Examples, in the cases of preparing slurries for polishing a phase-change material by adding potassium permanganate (Experimental Examples 7, 8, and 12) as an oxidizer in appropriate ratios, it may be confirmed that high polishing rates and low etching rates for crystalline $Ge_2Sb_2Te_5$ were obtained. Also, it may be confirmed that high polishing selectivity between $Ge_2Sb_2Te_5$ and $SiO_2$ was obtained and high-quality polished surfaces having low surface roughness and no scratch may be obtained.

Although the slurry for polishing phase-change materials and method for producing a phase-change device using same have been described with reference to the specific embodiments, they are not limited thereto. Therefore, it will be readily understood by those skilled in the art that various modifications and changes can be made thereto without departing from the spirit and scope of the present disclosure defined by the appended claims. Also, the slurry for polishing phase-change materials and method for producing a phase-change device using same may be used for polishing phase-change materials of various devices in addition to the phase-change memory device exemplified in the present specification.

What is claimed is:

1. A slurry for polishing a phase-change material comprising:
   an abrasive;
   an alkaline agent of TMAH (tetramethylammonium hydroxide);
   an oxidizer having a manganate ion ($MnO_4^-$) and a cation and having a standard reduction potential higher than that of perchlorates; and
   water,
   wherein the alkaline agent to the oxidizer weight ratio ranges from approximately 0.24 to approximately 0.6 and the oxidizer is included in an amount ranging from approximately 0.2 wt % to approximately 0.3 wt % based on 100 wt % of the slurry, and
   wherein a pH of the slurry is in a range of approximately 10 to approximately 12.

2. The slurry for polishing a phase-change material of claim 1, wherein the alkaline agent to the oxidizer weight ratio ranges from approximately 0.4 to approximately 0.6.

3. The slurry for polishing a phase-change material of claim 1, wherein the oxidizer $KMnO_4$.

4. The slurry for polishing a phase-change material of claim 1, further comprising: a polishing selectivity control agent included in an amount ranging from approximately 0.0001 wt % to approximately 3 wt % based on 100 wt % of the slurry for polishing.

5. The slurry for polishing a phase-change material of claim 4, wherein the polishing selectivity control agent comprises at least any one of polyacrylate, polymethylmethacrylate, and polybenzylmethacrylate, polyacrylamide, and a salt substituent and a copolymer thereof.

6. The slurry for polishing a phase-change material of claim 5, wherein the polishing selectivity control agent includes polyacrylamide.

7. The slurry for polishing a phase-change material of claim 1, further comprising a corrosion inhibitor included in an amount ranging from approximately 0.001 wt % to approximately 0.5 wt % based on 100 wt % of the slurry for polishing.

8. The slurry for polishing a phase-change material of claim 7, wherein the corrosion inhibitor comprises at least any one of aminotriazole and triazole.

9. The slurry for polishing a phase-change material of claim 1, wherein the abrasive comprises at least any one selected from the group consisting of colloidal silica, ceria, fumed silica, and alumina ($Al_2O_3$).

10. The slurry for polishing a phase-change material of claim 1, wherein the abrasive is included in an amount ranging from approximately 0.1 wt % to approximately 10 wt % based on 100 wt % of the slurry for polishing.

11. The slurry for polishing a phase-change material of claim 1, further comprising a surface roughness modifier included in an amount ranging from approximately 0.00001 wt % to approximately 2 wt % based on 100 wt % of the slurry for polishing.

12. The slurry for polishing a phase-change material of claim 11, wherein the surface roughness modifier is at least any one of hydroxylethylcellulose, carboxylmethyl cellulose, ethyl cellulose, methyl cellulose, hydroxypropyl cellulose, aminoethyl cellulose, oxyethyl cellulose, and hydroxybutyl methyl cellulose, and a salt compound thereof.

13. The slurry for polishing a phase-change material of claim 1, wherein the pH of the slurry is in a range of 10.5 to 11.

* * * * *